United States Patent
Saini et al.

(12) 
(10) Patent No.: US 7,236,411 B1
(45) Date of Patent: Jun. 26, 2007

(54) PROGRAMMABLE MEMORY ACCESS PARAMETERS

(75) Inventors: Rahul Saini, Union City, CA (US); Changsong Zhang, Santa Clara, CA (US); David E. Jefferson, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 189 days.

(21) Appl. No.: 11/187,356

(22) Filed: Jul. 21, 2005

(51) Int. Cl.
*G11C 7/00* (2006.01)
(52) U.S. Cl. .................. 365/194; 365/233; 365/189.05
(58) Field of Classification Search ................ 365/194, 365/233, 189.05
See application file for complete search history.

(56) References Cited

U.S. PATENT DOCUMENTS 6,735,129 B2 * 5/2004 Akasaki et al. ............. 365/194

\* cited by examiner

*Primary Examiner*—David Lam
(74) *Attorney, Agent, or Firm*—Townsend and Townsend and Crew LLP (57) ABSTRACT

A programmable device can configure memory access parameters to optimize the performance of one or more of its memory units. A memory unit includes one or more programmable delay units connected with clock, control and/or data signals. The configuration data of the programmable device specifies delay values for each programmable delay unit. A programmable delay unit includes at least two signal paths having different timing characteristics. A switching circuit controlled by configuration data is used to select one of the signal paths as the output of the programmable delay unit. Programmable delay units can be connected in series or in parallel to increase the number of possible delays and/or to specify timing parameters of portions of the memory unit in absolute or relative terms. Programmable delay units can be used to vary the timing characteristics of the memory unit and to control the voltage split used to read data.

29 Claims, 5 Drawing Sheets

PROGRAMMABLE MEMORY ACCESS PARAMETERS

BACKGROUND

The present invention relates to the field of programmable devices, and the systems and methods for programming the same. Programmable devices, such as FPGAs, typically includes thousands of programmable logic cells that use combinations of logic gates and/or look-up tables to perform a logic operation. Programmable devices also include a number of functional blocks having specialized logic devices adapted to specific logic operations, such as adders, multiply and accumulate circuits, phase-locked loops, and one or more memory units. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

The configuration of the logic cells, functional blocks, switching circuit, and other components of the programmable device is referred to as configuration data. Configuration data can be stored in volatile or non-volatile memory on the programmable device. Additionally, configuration data can be provided and temporarily or permanently loaded into the programmable device during its manufacturing. Users can specify a user design and generate corresponding configuration data using compilation software tools. The user-created configuration data can be temporarily or permanently loaded into one or more programmable devices to implement the user design. If the user design is changed, updated configuration data can be loaded into the programmable device to implement the changed user design.

Typically, the memory units in programmable devices are designed with timing margins sufficiently large so that despite manufacturing variations and operating conditions, most programmable devices will operate correctly. Although this ensures that the programmable devices are very reliable, excessively large timing margins can result in memory units operating more slowly than necessary. For user designs requiring frequent memory accesses, the speed of the memory units is often a critical limiting factor.

It is therefore desirable for a programmable device to include memory access parameters that can be adjusted after the device is manufactured to maximize memory unit performance. It is desirable for the manufacturer to be able to set memory access parameters of the programmable device after manufacturing and for programmable device users to be able to set memory access parameters of the programmable device to meet the requirements of specific user designs. It is further desirable for the programmable device to implement adjustable memory access parameters with minimal additional overhead.

BRIEF SUMMARY

An embodiment of a programmable device can configure memory access parameters to optimize the performance of one or more of its memory units. In an embodiment, each memory unit includes one or more programmable delay units connected with clock and/or data signals. The configuration data of the programmable device specifies delay values for each programmable delay unit. The programmable delay units are capable of changing the timing of at least one portion of the memory unit relative to another portion of the memory unit. In an embodiment, a programmable delay unit includes at least two signal paths having different timing characteristics. A switching circuit or multiplexer controlled by configuration data is used to select one of the signal paths as the output of the programmable delay unit. Programmable delay units can be connected in series or in parallel to increase the number of possible delays and/or to specify timing parameters of portions of the memory unit in absolute or relative terms. Programmable delay units can be used to vary the timing characteristics of portions of the memory unit and to control the voltage split used to read data from the memory unit.

BRIEF DESCRIPTION OF THE DRAWINGS

The invention will be described with reference to the drawings, in which.

DETAILED DESCRIPTION

Figure 1:
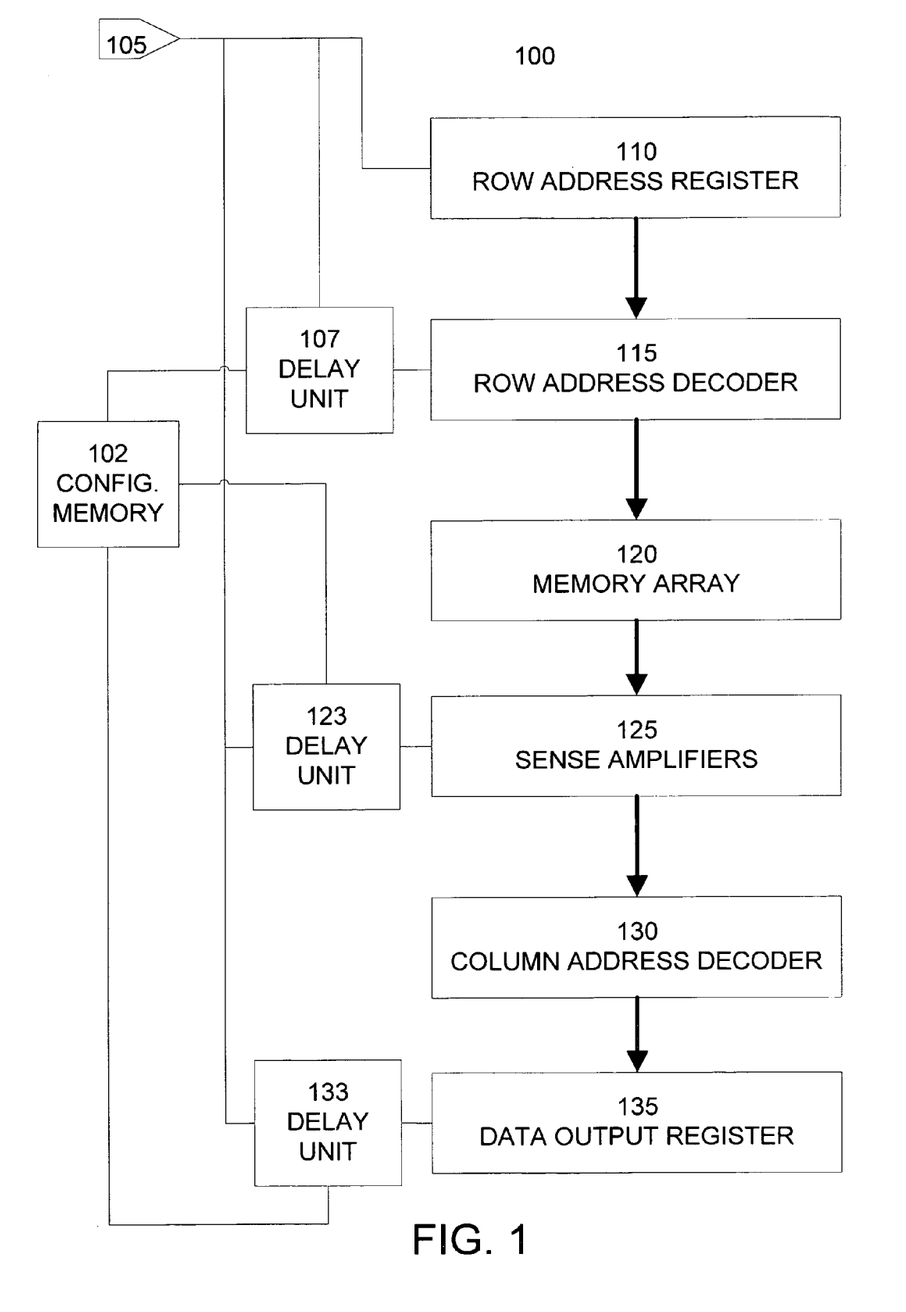
FIG. 1 illustrates a memory unit having programmable access parameters according to an embodiment of the invention.

FIG. 1 illustrates a memory unit 100 having programmable access parameters according to an embodiment of the invention. In an embodiment, a programmable device includes numerous memory units similar to memory unit 100. Memory unit 100 is controlled by a clock signal 105. During a memory read operation, the row address register unit 110 of the memory unit 100 receives a portion of memory address corresponding with at least one of a number of rows of memory cells in a memory array 120.

Clock signal 105 passes through programmable delay unit 107 to connect with the row address register unit 110. The programmable delay unit 107 is capable of delaying the clock signal 105 by a time period specified by configuration data of the programmable device. In an embodiment, the programmable delay unit 107 applies one of a set of possible timing delays to the clock signal. The timing delay applied by the programmable delay unit 107 is specified by configuration data stored in configuration memory 102.

The operation of the row address register unit 110 is synchronized with the signal received from the programmable delay unit 107. Because the configuration data can change the timing delay applied by the programmable delay unit 107 to the clock signal 105, the timing of the row address register unit 110 can be adjusted relative to the clock signal 105.

The output of the row address register unit 110 includes control signals for accessing the memory array 120. In an embodiment, this includes control signals operating bit line pre-charge and row address decoder circuits used in static or dynamic random access memory known in the art. However, different types and architectures of memory can require different supporting circuits and employ different control signals accordingly.

In memory unit 100, a control signal output from row address register unit 110 is received by a row address decoder 115. In this embodiment, the row address decoder 115 is synchronized with the clock signal 105. Because the row address register unit 110 is synchronized with a delayed version of clock signal 105, the programmable delay unit 107 is capable of increasing or decreasing the relative timing between the row address register unit 110 and the row address decoder 115.

The output of the row address decoder includes control signals for operating one or more word lines of the memory array 120. Memory array 120 can be any type of electronic memory, including volatile memory devices such as static or dynamic random access memory and non-volatile memory devices. Furthermore, memory array 120 can have any size, any data width, and any number of read and write ports.

The output of memory array 120 is one or more bits of data. In an embodiment, these bits are represented as voltage differentials on adjacent bit line connected with the memory array 120. Sense amplifiers unit 125 detects voltage differences between adjacent bit lines and outputs corresponding binary data values to the column address decoder unit 130.

In an embodiment, sense amplifiers unit 125 is synchronized with the output of programmable delay unit 123. Like programmable delay unit 107, programmable delay unit 123 applies a delay to the clock signal 105. The delay applied by programmable delay unit 123 is specified by the configuration data stored in configuration memory 102. Because the sense amplifiers unit 125 is synchronized with a delayed version of clock signal 105, the programmable delay unit 123 is capable of increasing or decreasing the relative timing between the memory array 120 and the sense amplifiers unit 125.

The column address decoder unit 130 receives data bits from the sense amplifiers unit 125 that have be detected from one or more columns of memory cells in the memory array 120. The column address decoder unit 130 also receives a portion of a memory address specifying one or more columns of memory cells requested by the programmable device. In response, the column address decoder unit 130 selects a portion of data bits provided by the sense amplifiers 125 and transfers the selected bits to the data output register unit 135.

The data output register unit 135 latches the data bits retrieved from the memory array 120 for eventual retrieval by other portions of the programmable device. In an embodiment, the data output register unit 135 is synchronized with the output of programmable delay unit 133. Programmable delay unit 133 applies a timing delay to the clock signal 105 as specified by the configuration data stored in configuration memory 102. Because the data output register 135 is synchronized with a delayed version of clock signal 105, the programmable delay unit 133 is capable of increasing or decreasing the relative timing between the column address decoder unit 130 and the data output register unit 135.

In an embodiment, different portions of the configuration data control programmable delay units 107, 123, and 133, allowing the delay of each programmable delay unit to be independently specified. In an embodiment of the memory unit 100, the programmable delay units 107, 123, and 133 can each include delay paths having different timing delay values, thus enabling each programmable delay unit to potentially apply different ranges of timing delay to the clock signal 105.

Additionally, the programmable delay unit 123 can be used to adjust the magnitude of the voltage difference between adjacent bit lines that is interpreted by the sense amplifiers unit 125 as binary data. In many typical types of memory devices, adjacent bit lines are selectively connected with a memory cell. To read data from a memory cell, the bit lines are electrically disconnected from the memory cell and precharged to a voltage. The charged bit lines are then connected with the memory cell, which alters the voltages on the bit line based on the value of the data stored in the memory cell.

The sense amplifiers unit 125 measures the difference in voltage between the bit lines caused by the value of the memory cell to deduce the value of the memory cell. Additionally, the voltages on the bit lines typically decay exponentially due to capacitive leakage. During this decay, the magnitude of the difference in voltage between bit lines will vary over time. By varying the timing of the sense amplifiers unit 125, which can be accomplished using programmable delay unit 123, the sense amplifiers unit 125 can be configured to measure the bit line voltages at a different time during this voltage decay. Thus, depending upon when the sense amplifiers unit 125 measures the bit line voltages, a different magnitude of voltage difference will be measured.

FIG. 1 illustrates the components associated with a read operation of memory unit 100. However, embodiments of the invention are generally applicable to components associated with other operations of the memory unit, including write operations. In general, programmable delay units such as those shown in FIG. 1 can be added to the clock path of any component of a memory unit to enable the adjustment of that component's timing relative to other components of the memory unit. Additionally, in any portions of the memory unit in which voltages increase or decrease over time, programmable delay units can be used to enable adjustments to the value of these voltages. In further embodiments, programmable delay units can be added to the signal path associated with control signals or data signals in the memory unit so as to enable adjustments to their timing.

Figure 2:
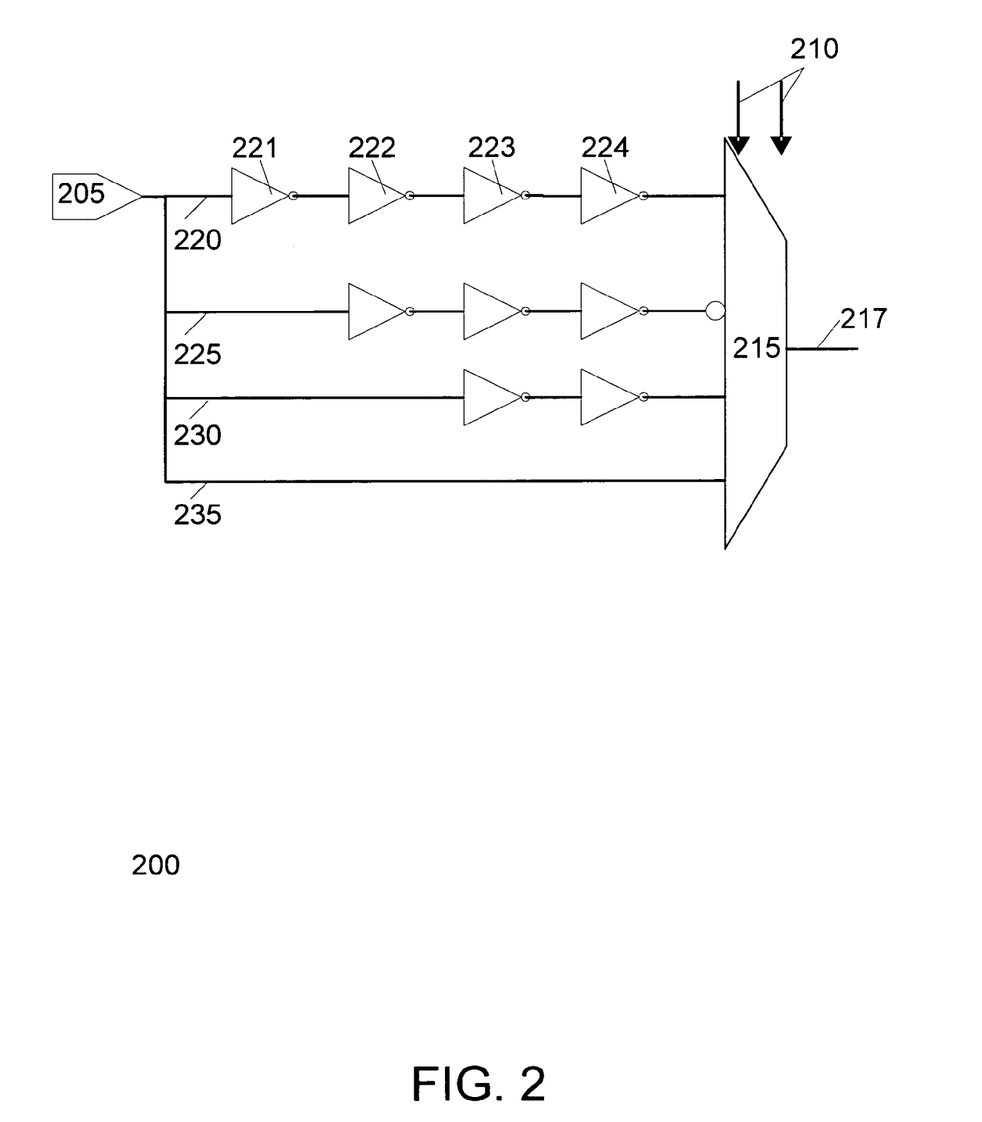
FIG. 2 illustrates a programmable delay unit according to an embodiment of the invention.

FIG. 2 illustrates a programmable delay unit 200 according to an embodiment of the invention. Programmable delay unit 200 includes a signal input 205. Signal input 205 can receive clock signals, data signals, or control signals used by a memory unit. Programmable delay unit 200 also includes one or more delay select inputs 210. In an embodiment, delay select inputs 210 control a multiplexer 215 or other type of selection circuit.

The signal input 205 is split into two or more delay paths, such as delay paths 220, 225, 230, and 235. Each delay path may include one or more active or passive delay elements adapted to delay a signal by a predetermined amount of time. In an embodiment, the delay element is an inverter logic gate. For example, delay path 220 includes inverters 221, 222, 223, and 224. Additionally, delay path 235 does not include any delay elements, enabling the programmable delay unit 200 to pass the signal from signal input 205 with minimal delay. In cases where there are an odd number of inverters on a delay path, such as example delay path 225, the associated input of an embodiment of the multiplexer 215 can be inverted so that the signal is not inverted by the programmable delay unit 200.

The value of delay select inputs 210 are used to connect one of the delay paths with the signal output 217. The value of the delay select inputs 210 can be binary or one-hot encoded, which can reduce multiplexer 215 complexity at the cost of an increased number of delay select inputs and configuration data bits.

The value of the delay select inputs is determined from the value of one or more bits of configuration data. In an embodiment, the configuration data is stored in the configuration memory of the programmable device. This portion of the configuration data can be stored in volatile or non-volatile portion of the configuration memory. In an embodiment, the manufacturer of the programmable device measures or estimates the performance of the memory unit and sets configuration data to maximize performance of the memory unit while ensuring reliable operation. In the case that the delay select configuration data is to be stored in volatile memory, the manufacturer can provide a copy of this portion of the configuration data to users to be incorporated into their user designs. In another embodiment, the delay select values can be specified directly by users as part of their user designs. It is then up to the users to test programmable devices implementing their designs to ensure that the memory units are operating correctly.

Figure 3:
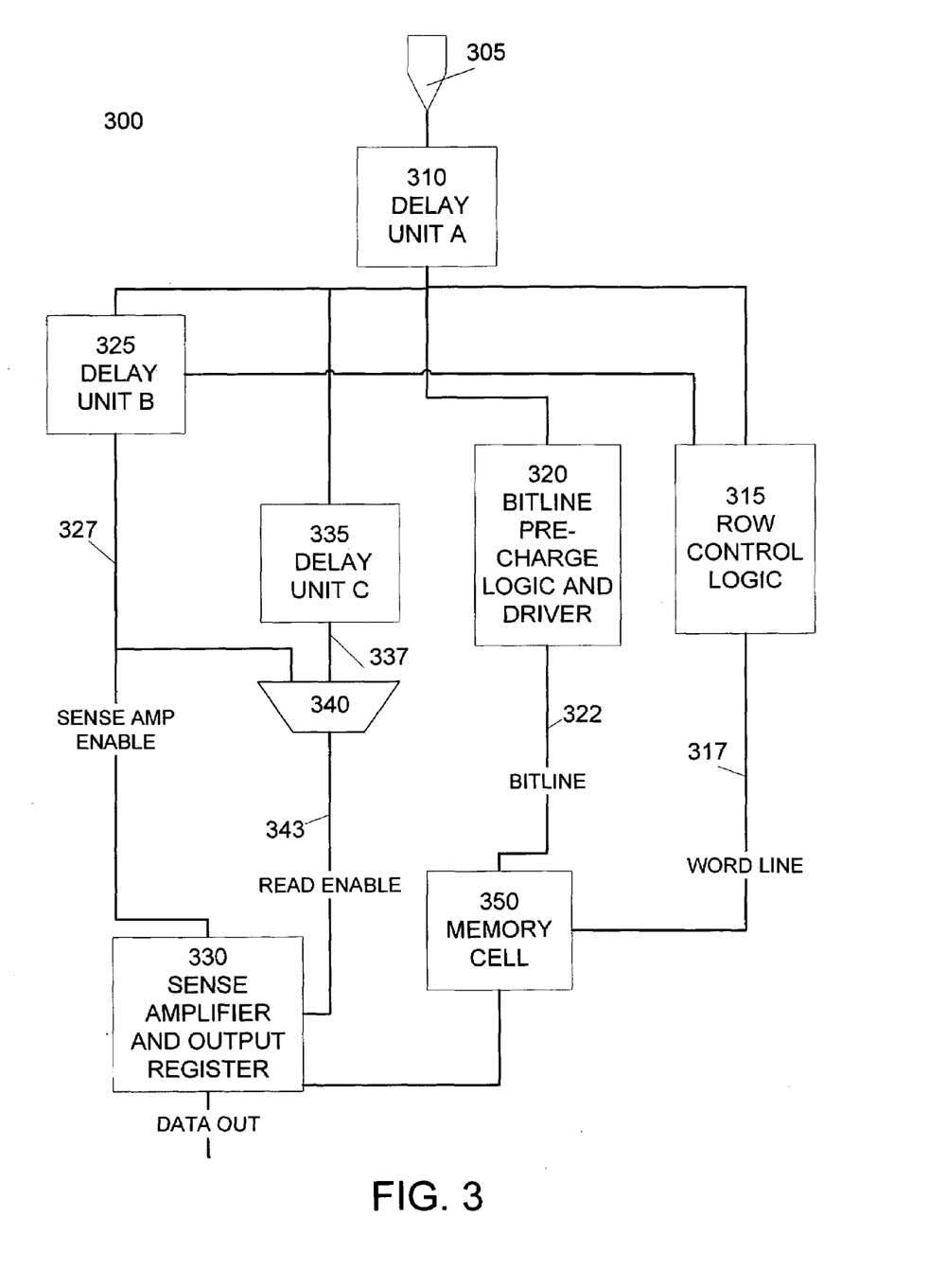
FIG. 3 illustrates a memory unit having programmable access parameters according to an embodiment of the invention.

FIG. 3 illustrates a memory unit 300 having programmable access parameters according to an embodiment of the invention. Memory unit 300 includes a clock signal input 305. In this embodiment, clock signal input is connected with the input of programmable delay unit 310. Other portions of the memory unit 300 that have been omitted for clarity can receive the undelayed clock signal.

The programmable delay unit A 310 delays the clock signal by an amount specified by one or more configuration bits stored in a configuration memory, which is omitted from FIG. 3 for clarity. The delayed clock signal, referred to as clock_A, is provided to row control logic 315, bit line precharge logic and driver 320, programmable delay unit B 325, and programmable delay unit C 335. Row control logic 315 functions similarly to row address decoder 115. The output 317 of row control logic 315 is one or more word line control signals. The bit line precharge logic and driver 320 precharges bit lines in preparation of reading data from a memory cell 350, as discussed above. The output of the bit line precharge logic and driver 320 is a bit line voltage applied to one or more bit lines 322. Both outputs 317 and 322 are applied to appropriate portions of the memory cell 350.

Programmable delay unit B 325 receives clock_A from programmable delay unit A 310 and applies an additional delay to this signal. The delay applied by programmable delay unit B 325 is specified by one or more configuration bits stored in configuration memory. In an embodiment, the output 327 of programmable delay unit B 325 is used as a sense amplifier enable signal for sense amplifier and output register unit 330. Unit 330 includes a sense amplifier similar to those in sense amplifiers unit 125 and a data output register similar to that in data output register unit 135. In this embodiment, the sense amplifier enable signal activates the sense amplifier in unit 330 to read data from the memory cell 350. Because programmable delay units A and B, 310 and 325, are connected in series, the time period between precharging bit lines and reading the memory cell 350 can be directly specified using programmable delay unit B, 325. Similarly, the output of programmable delay unit B 325 can also be provided to all or a portion of row control logic 315 in an embodiment of circuit 300.

Programmable delay unit C 335 also receives the clock_A signal from programmable delay unit 310. The delay applied by programmable delay unit C 335 is specified by one or more configuration bits stored in configuration memory. In an embodiment, the output 337 of programmable delay unit C 335 is input to multiplexer 340. Multiplexer 340 also receives the output 327 of programmable delay unit B 325. The multiplexer 340 is controlled by one or more configuration bits stored in the configuration memory. Using multiplexer 340, the configuration bits can selectively connect either the output 327 of programmable delay unit B 325 or the output 337 of programmable delay unit 335 to multiplexer output 343.

In an embodiment, multiplexer output 343 serves as a read enable signal for the data output register in unit 330. Upon receiving the read enable signal, the data output register in unit 330 latches the output of the sense amplifier in unit 330. By selecting between the two programmable delay units 325 and 335, the timing of the read enable signal from multiplexer output 343 can be varied substantially.

For purposes of clarity, other components of the memory unit 300, such as column select circuitry, have been omitted. However, in general, these components function in a similar manner as that known in the art.

Figure 4:
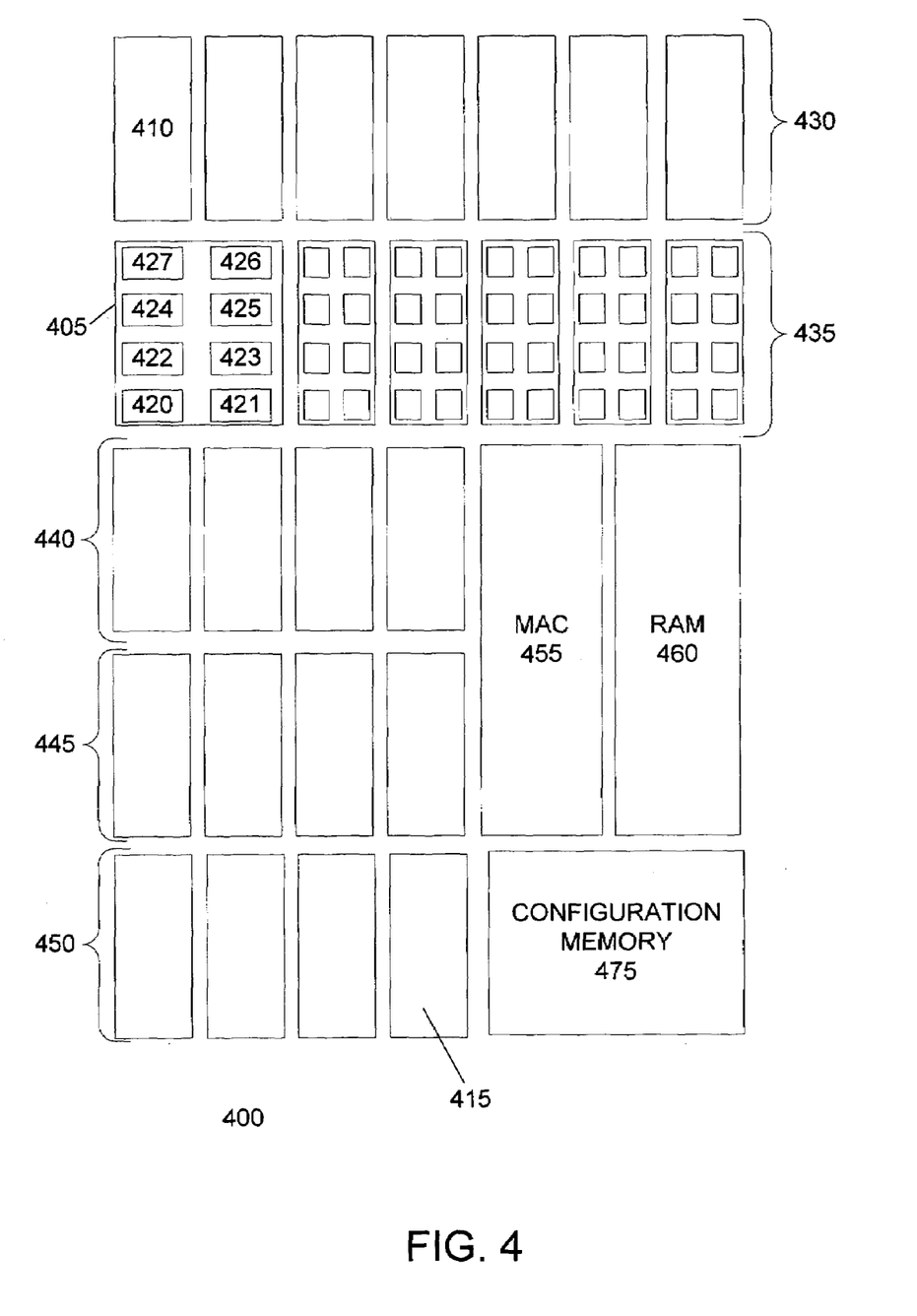
FIG. 4 illustrates a portion of a programmable device suitable for implementing an embodiment of the invention.

FIG. 4 illustrates a portion of a programmable device suitable for implementing an embodiment of the invention. Programmable device 400 includes a number of logic array blocks (LABs), such as LABs 405, 410, 415. Each LAB includes a number of programmable logic cells using logic gates and/or look-up tables to perform a logic operation. LAB 405 illustrates in detail logic cells 420, 421, 422, 423, 424, 425, 426, and 427. Logic cells are omitted from other LABs in FIG. 4 for clarity. The LABs of device 400 are arranged into rows 430, 435, 440, 445, and 450. In an embodiment, the arrangement of logic cells within a LAB and of LABs within rows provides a hierarchical system of configurable connections of a programmable switching circuit, in which connections between logic cells within a LAB, between cells in different LABs in the same row, and between cell in LABs in different rows require progressively more resources and operate less efficiently.

In addition to logic cells arranged in LABs, programmable device 400 also include specialized functional blocks, such as multiply and accumulate block (MAC) 455 and random access memory block (RAM) 460. The configuration of the programmable device is specified at least in part by configuration data stored in configuration memory 475. The configuration data can include memory access parameters as well as the configuration of the programmable switching circuit. Additional configuration data can be stored in other parts of the programmable device. For example, the configuration data can include look-up table data to be stored in look-up table hardware in a logic cell. The look-up table data specifies a function implemented by the look-up table hardware. For clarity, the portion of the programmable device 400 shown in FIG. 4 only includes a small number of logic cells, LABs, and functional blocks. Typical programmable devices will include thousands or tens of thousands of these elements.

Figure 5:
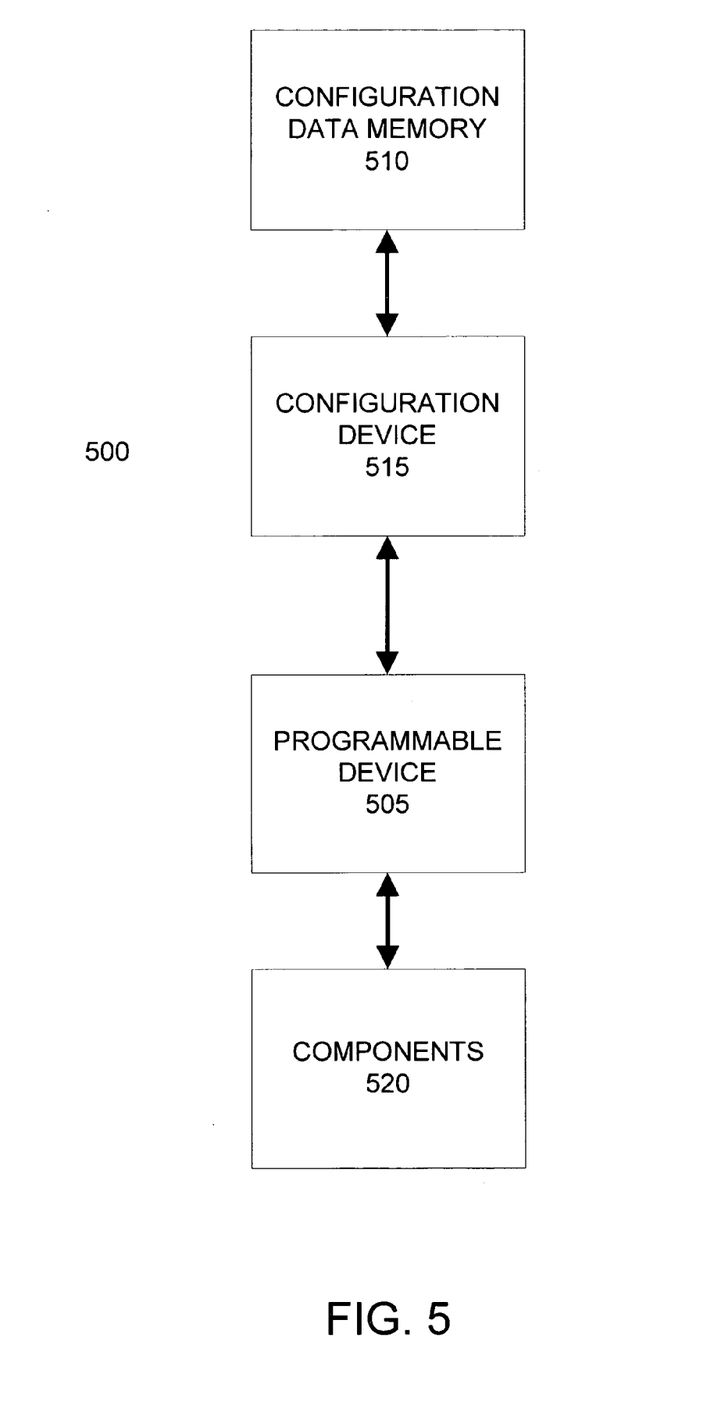
FIG. 5 illustrates a system with a programmable device according to an embodiment of the invention.

FIG. 5 illustrates a system 500 with a programmable device 505. The programmable device 505 can be configured according to configuration data to perform different functions. In an embodiment, the configuration data for the programmable device is stored in a non-volatile configuration memory 510. A configuration device 515 is connected with the programmable device 505 and configuration memory 510. The configuration device 515 can copy the configuration data from configuration memory 510 to the programmable device 505.

In an embodiment, the configuration device 515 is adapted to load the configuration information into the programmable device 505 upon receiving a request from the programmable device 515. This loading process is typically a sequence of events for sending configuration information to the programmable device 505 and verifying that the configuration information was received and loaded correctly. Although shown in FIG. 5 as separate devices, the configuration device 515 and configuration memory 510 can be integrated into a specialized memory device including logic specifically adapted to communicate configuration information with a programmable device 505. In additional embodiments, the configuration device 515 can be a general-purpose processor coupled with an integrated or separate configuration memory device 510 and running software adapted to configure the programmable device 505.

System 500 can be implemented on one or more circuit boards. In additional embodiments, other components 520 are included in the system and adapted to interact with the programmable device 505.

Further embodiments can be envisioned to one of ordinary skill in the art after reading the attached documents. For example, although the invention has been discussed with reference to programmable devices, it is equally applicable to any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A programmable device comprising:
   a plurality of programmable logic cells adapted to perform a function specified by configuration data;
   a memory unit adapted to store data used by the plurality of programmable logic cells;
   a configurable switching circuit adapted to communicate signals at least among the plurality of programmable logic cells and the memory unit; and
   a configuration memory adapted to store configuration data specifying at least a portion of the characteristics of the programmable device, wherein the configuration data includes memory access parameter data;
   wherein the memory unit comprises:
      a memory array adapted to store the data;
      a first programmable delay unit adapted to receive a first signal and to delay the first signal for a time period specified by at least a first portion of the memory access parameter data; and
      a first component connected with an output of the first programmable delay unit and adapted to facilitate access to the data stored by the memory array in response to the delayed first signal from the output of the first programmable delay unit.

2. The programmable device of claim 1, wherein the memory unit comprises:
   a second component adapted to facilitate access to data stored by the memory array in response to the first signal.

3. The programmable device of claim 2, wherein the memory access parameter data specifies a relative timing delay between the operation of the second component and the first component.

4. The programmable device of claim 1, wherein the memory unit comprises:
   a second programmable delay unit adapted to receive a second signal and to delay the second signal for second time period specified by at least a portion of the memory access parameter data; and
   a second component connected with an output of the second programmable delay unit and adapted to facilitate access to data stored by the memory array in response to the delayed second signal from the output of the second programmable delay unit.

5. The programmable device of claim 4, wherein the second signal is the delayed first signal from the output of the first programmable delay unit.

6. The programmable device of claim 4, wherein the second signal is equal to the first signal.

7. The programmable device of claim 1, wherein the first programmable delay unit comprises:
   a first signal path connected with the first signal and having a first delay;
   a second signal path connected with the first signal and having a second delay different from the first delay; and
   a switching circuit connected with the first and second signal paths and adapted to connect either the first signal path or the second signal path with the output of the programmable delay unit in response to at least the first portion of the memory access parameter data.

8. The programmable device of claim 7, wherein the switching circuit includes a multiplexer.

9. The programmable device of claim 7, wherein the first signal path includes a first number of delay elements and the second signal path includes a second number of delay elements.

10. The programmable device of claim 7, wherein the delay elements include logic gates.

11. The programmable device of claim 1, wherein the first signal is a clock signal.

12. The programmable device of claim 1, wherein the first signal is a control signal.

13. The programmable device of claim 1, wherein the first signal is a data signal.

14. The programmable device of claim 1, wherein the first component is adapted to facilitate reading the data stored by the memory array.

15. The programmable device of claim 1, wherein the first component is a row address decoder unit.

16. The programmable device of claim 1, wherein the first component is a bit line precharge unit.

17. The programmable device of claim 1, wherein the first component is a sense amplifier unit.

18. The programmable device of claim 1, wherein the first component is a data output register.

19. The programmable device of claim 1, further comprising:
   a circuit board including the programmable device and at least additional device.

20. The programmable device of claim 1, wherein the additional device is a configuration device including logic adapted to load the configuration data into the configuration data of the programmable device.

21. A memory unit integrated in a device, the memory unit comprising:
   a data input interface adapted to receive data from another portion of the device;
   a configuration data interface adapted to receive at least a portion of configuration data from a configuration memory of the device, wherein the portion of the configuration data includes memory access parameter data;

a memory array adapted to store the data;

a data output interface adapted to provide data retrieved from the memory array to another portion of the device;

a first programmable delay unit adapted to receive a first signal and to delay the first signal for a time period specified by at least a first portion of the memory access parameter data; and a first component connected with an output of the first programmable delay unit and adapted to facilitate access to the data stored by the memory array in response to the delayed first signal from the output of the first programmable delay unit.

22. The memory unit of claim 21, further comprising:

a second component adapted to facilitate access to data stored by the memory array in response to the first signal.

23. The memory unit of claim 21, further comprising:

a second programmable delay unit adapted to receive a second signal and to delay the second signal for second time period specified by at least a portion of the memory access parameter data; and a second component connected with an output of the second programmable delay unit and adapted to facilitate access to data stored by the memory array in response to the delayed second signal from the output of the second programmable delay unit.

24. The memory device of claim 23, wherein the second signal is the delayed first signal from the output of the first programmable delay unit.

25. The memory device of claim 23, wherein the second signal is equal to the first signal.

26. The memory device of claim 21, wherein the first programmable delay unit comprises:

a first signal path connected with the first signal and having a first delay;

a second signal path connected with the first signal and having a second delay different from the first delay; and a switching circuit connected with the first and second signal paths and adapted to connect either the first signal path or the second signal path with the output of the programmable delay unit in response to at least the first portion of the memory access parameter data.

27. The memory unit of claim 21, wherein the first signal is a clock signal.

28. The memory unit of claim 21, wherein the first signal is a control signal.

29. The memory unit of claim 21, wherein the first signal is a data signal.

* * * * *